US012787784B2

(12) United States Patent
Wu

(10) Patent No.: US 12,787,784 B2
(45) Date of Patent: Nov. 3, 2026

(54) STRUCTURE INCLUDING MOISTURE BARRIER ALONG INPUT/OUTPUT OPENING AND RELATED METHOD

(71) Applicant: GlobalFoundries U.S. Inc., Malta, NY (US)

(72) Inventor: Zhuojie Wu, Port Chester, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 541 days.

(21) Appl. No.: 18/154,143

(22) Filed: Jan. 13, 2023

(65) Prior Publication Data

US 2024/0243078 A1 Jul. 18, 2024

(51) Int. Cl.

| | |
|---|---|
| ***H10W 74/43*** | (2026.01) |
| ***G02B 6/122*** | (2006.01) |
| ***G02B 6/30*** | (2006.01) |
| ***G02B 6/36*** | (2006.01) |
| ***H10W 42/00*** | (2026.01) |

(Continued)

(52) U.S. Cl.

CPC ............ *H10W 42/00* (2026.01); *G02B 6/122* (2013.01); *G02B 6/30* (2013.01); *G02B 6/3652* (2013.01); *G02B 2006/12166* (2013.01)

(58) Field of Classification Search

CPC ... H01L 23/564; H01L 23/585; H01L 23/562; H01L 23/291; H01L 23/31; G02B 6/122; G02B 6/30; G02B 6/3652; G02B 2006/12166; G02B 6/4202; G02B 6/4228;

(Continued)

(56) References Cited

U.S. PATENT DOCUMENTS 7,564,387 B1 7/2009 Vawter
8,530,997 B1 9/2013 Yang (Continued)

FOREIGN PATENT DOCUMENTS

KR 20020026995 A 4/2002

OTHER PUBLICATIONS

Barwicz et al., "Integrated Metamaterial Interfaces for Self-Aligned Fiber-to-Chip Coupling in Volume Manufacturing," EEE Journal of Selected Topics in Quantaum Electronics, 25:4700313, May/Jun. 2019 (13 pages).

(Continued)

*Primary Examiner* — Zandra V Smith
*Assistant Examiner* — Daniel J Hibbert
(74) *Attorney, Agent, or Firm* — Francois Pagette; Hoffman Warnick LLC

(57) ABSTRACT

A structure includes an integrated circuit chip in a substrate, and an I/O opening extending inwardly from an edge of the integrated circuit chip. A dielectric moisture barrier includes a first portion extending along a side of the I/O opening, a second portion extending along the edge of the integrated circuit chip, and a third portion coupling the first moisture barrier portion to the second moisture barrier portion to complete the moisture barrier between the edge of the integrated circuit chip and the I/O opening. The third portion is distanced from the corner of the integrated circuit chip where the I/O opening meets the edge of the chip to prevent damage to the moisture barrier from fabrication processes, such as chip dicing, chip handling or other processes. Various crack stop configurations are also provided to further protect the moisture barrier from damage.

20 Claims, 8 Drawing Sheets

(51) Int. Cl.
*H10W 74/10* (2026.01)
*G02B 6/12* (2006.01)

(58) Field of Classification Search
CPC ... H10W 42/00; H10W 42/121; H10W 74/43; H10W 74/10
See application file for complete search history.

(56) References Cited

U.S. PATENT DOCUMENTS

| | | | | |
|---|---|---|---|---|
| 10,770,412 | B2 | 9/2020 | Polomoff et al. | |
| 11,145,606 | B1 | 10/2021 | Polomoff et al. | |
| 2004/0150073 | A1 * | 8/2004 | Matumoto | H10W 42/00 257/E23.116 |
| 2006/0006493 | A1 | 1/2006 | Kawano et al. | |
| 2006/0055005 | A1 * | 3/2006 | Furusawa | H10W 42/00 257/637 |
| 2017/0345773 | A1 * | 11/2017 | Baek | H10P 74/277 |
| 2020/0035620 | A1 | 1/2020 | Yang et al. | |
| 2021/0183791 | A1 | 6/2021 | Sahin et al. | |
| 2021/0305172 | A1 * | 9/2021 | Polomoff | G02B 6/3652 |
| 2022/0291464 | A1 * | 9/2022 | Polomoff | G02B 6/122 |
| 2024/0304570 | A1 | 9/2024 | Wu | |

OTHER PUBLICATIONS

Cho et al., “Optical performance and reliability assessment from self-aligned single mode fiber attach for O-band silicon photonics platform,” 2022 IEEE 72nd Electronic Components and Technology Conference (ECTC), 2022 IEEE, pp. 403-409 (7 pages).

Peng et al., “A CMOS Compatible Monolithic Fiber Attach Solution with Reliable Performance and Self-Alignment,” Th31.4.pdf, OFC 2020, OSA 2020 (4 pages).

Wu et al., “Chip-Package Interaction Challenges for Large Die Applications,” 2018 IEEE 68th Electronic Components and Technology Conference (ECTC), 2018 IEEE, pp. 656-662 (7 pages).

Wu et al., “CPI Reliability Challenges of Large Flip Chip Packages and Effects of Kerf Size and Substrate,” 978-1-5386-9504-3/19, 2019 IEEE (7 pages).

European Search Report for corresponding EP Application No. 23195594.9- 1212 dated Feb. 5, 2024, 11 pages.

Non Final Office Action dated Nov. 19, 2025 for U.S. Appl. No. 18/181,123, filed Mar. 9, 2023; pp. 9.

Notice of Allowance dated Jun. 15, 2026 for U.S. Appl. No. 18/181,123, filed Mar. 9, 2023; p. 10.

* cited by examiner

STRUCTURE INCLUDING MOISTURE BARRIER ALONG INPUT/OUTPUT OPENING AND RELATED METHOD

BACKGROUND

The present disclosure relates to photonics integrated circuits (PIC) and, more particularly, to a moisture barrier for preventing moisture ingress along an input/output opening in an integrated circuit chip, and a related method.

Integrated circuit (IC) chips can fail or be damaged when moisture enters the structure, e.g., within a guard ring. Photonics integrated circuit (PIC) chips are especially prone to moisture ingress due to input/output openings in their guard ring used, for example, to connect to external photonics components. Moisture barriers, such as a thin dielectric layer of silicon nitride (SiN), are used around the chip periphery and the input/output openings. However, the moisture barriers are subject to damage at the outer corners of the input-output openings during, for example, chip dicing, chip handling or other processes. The damage can lead to a heightened risk of moisture ingress. Crack stops are also used around a chip to prevent cracks from propagating through a chip. Crack stops may be chamfered at certain corners of the IC chip to reduce stress, but chamfers do not address the damage to the moisture barrier.

SUMMARY

All aspects, examples and features mentioned below can be combined in any technically possible way.

An aspect of the disclosure provides a structure, comprising: an integrated circuit chip including a substrate; an input/output (I/O) opening extending inwardly from an edge of the integrated circuit chip; and a dielectric moisture barrier including: a first moisture barrier portion extending along a side of the I/O opening, a second moisture barrier portion extending along the edge of the integrated circuit chip, and a third moisture barrier portion coupling the first moisture barrier portion to the second moisture barrier portion to complete the moisture barrier between the edge of the integrated circuit chip and the I/O opening.

An aspect of the disclosure provides a structure, comprising: an integrated circuit chip including a substrate; an input/output (I/O) opening extending inwardly from an edge of the integrated circuit chip; and a dielectric moisture barrier including: a first moisture barrier portion extending along a side of the I/O opening, a second moisture barrier portion extending along an entirety of the edge of the integrated circuit chip except at the I/O opening, a third moisture barrier portion coupling an end of the second moisture barrier portion at a distance from the I/O opening to a location between ends of the first moisture barrier portion extending along the side of the I/O opening, and wherein the second moisture barrier portion includes a chamfer portion at each outer corner of the integrated circuit chip.

An aspect of the disclosure provides a method, comprising: forming an integrated circuit chip including a substrate; forming an input/output (I/O) opening extending inwardly from an edge of the integrated circuit chip; and forming a dielectric moisture barrier including: a first moisture barrier portion extending along a side of the I/O opening, a second moisture barrier portion extending along the edge of the integrated circuit chip, and a third moisture barrier portion coupling the first moisture barrier portion to the second moisture barrier portion to complete the moisture barrier between the edge of the integrated circuit chip and the I/O opening.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
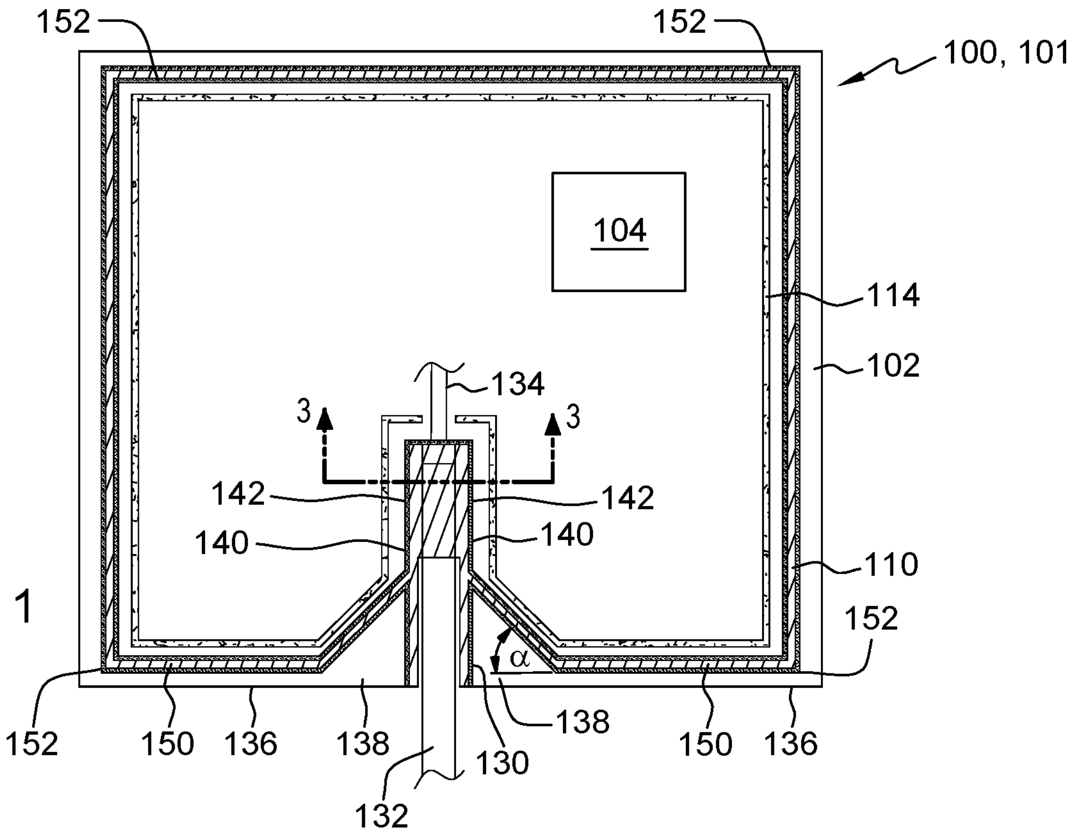
FIG. 1 shows a schematic top-down view of a structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over"

another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a structure including a dielectric moisture barrier including chamfers near an input/output (I/O) opening that prevents fabrication process-related damage near the I/O opening that can lead to moisture ingress. The structure includes an integrated circuit (IC) chip in a substrate, and an I/O opening extending inwardly from an edge of the IC chip. The dielectric moisture barrier includes a first moisture barrier portion extending along a side of the I/O opening, a second moisture barrier portion extending along the edge of the substrate, and a third moisture barrier portion coupling the first moisture barrier portion to the second moisture barrier portion to complete the moisture barrier between the edge of the IC chip and the I/O opening. The third moisture barrier portion is distanced from the corner of the integrated circuit chip where the I/O opening meets the edge of the chip to prevent damage to the moisture barrier from fabrication processes, such as chip dicing, chip handling or other processes. Various crack stop configurations are also provided to further protect the moisture barrier from damage.

Figure 2:
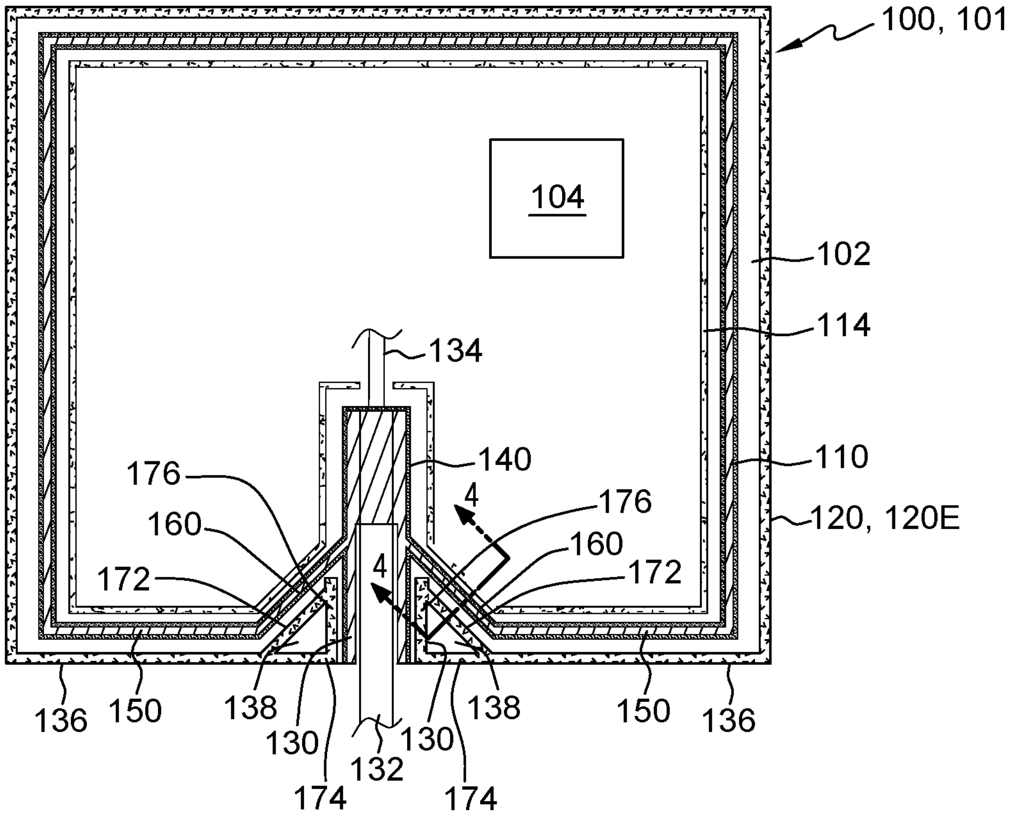
FIG. 2 shows a schematic top-down view of a structure according to embodiments of the disclosure.
Figure 3:
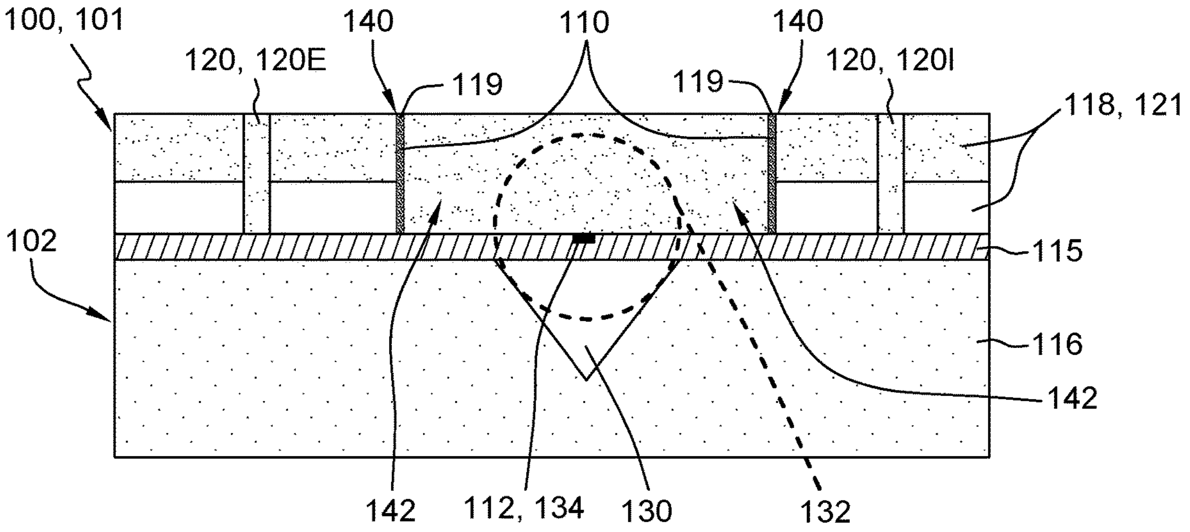
FIG. 3 shows a cross-sectional view of a structure along view line 3-3 in FIG. 1.
Figure 4:
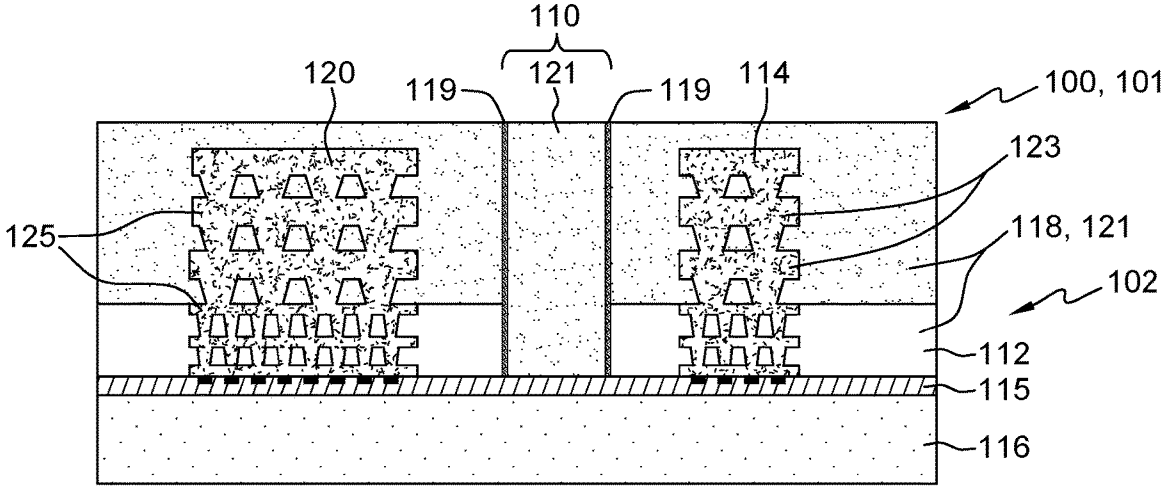
FIG. 4 shows a cross-sectional view of a structure along view line 4-4 in FIG. 2.

FIGS. 1 and 2 show schematic top-down views of a structure 100, FIG. 3 shows a cross-sectional view along view line 3-3 in FIG. 1, and FIG. 4 shows a cross-sectional view along view line 4-4 in FIG. 2, according to embodiments of the disclosure.

Structure 100 includes an integrated circuit (IC) chip 101 including a substrate 102. Substrate 102 can be broadly defined to include a semiconductor substrate upon which active circuitry 104 (FIGS. 1 and 2 only) and other structures are formed, such as but not limited to: middle-of-line (MOL) and/or back-end-of-line (BEOL) interconnects that electrically interconnect active circuitry 104 and/or photonic components, and/or related packaging layers over BEOL interconnects. Substrate 102 can be in the form of bulk semiconductor or a semiconductor-on-insulator (SOI) substrate (latter shown). In one non-limiting example, as shown in FIGS. 3 and 4, where an SOI substrate is used, substrate 102 may include a semiconductor-on-insulator (SOI) layer 112 over a buried insulator layer 113 over a base semiconductor layer 116. SOI layer 112 and base semiconductor layer 116 may include silicon, silicon germanium or other semiconductor materials. Buried insulator layer 113 may include any appropriate dielectric such as but not limited to silicon dioxide. As also shown in FIGS. 3 and 4, various MOL and/or BEOL interconnects 118 that electrically interconnect active circuitry 104 and/or photonic components may be provided over substrate 102.

Structure 100 may include any now known or later developed integrated circuit or photonics integrated circuit including any variety of active circuitry 104 that may experience moisture ingress. Active circuitry 104 can include any form of circuity including but not limited to: logic, memory, and/or photonics. Moisture ingress into structure 100 and active circuitry 104 can damage the physical structure of, for example, active circuitry 104, interconnect layers, photonics, etc.

To prevent moisture ingress, structure 100 includes a dielectric moisture barrier 110 surrounding active circuitry 104 (FIGS. 1 and 2 only). Dielectric moisture barrier 110 (hereafter "moisture barrier 110" for brevity) may include any now known or later developed barrier configured to resist, and ideally prevent, moisture ingress. Moisture barrier 110 may include one or more layers of dielectric. For example, moisture barrier 110 may include but is not limited to one or more elongated members of dielectric positioned in one or more dielectric interconnect layers 118 (FIGS. 3-4). In one non-limiting example, shown in FIG. 4, moisture barrier 110 may include one or more silicon nitride or other moisture impervious dielectric material elements 119 surrounded by a dielectric layer 121, e.g., an interlayer dielectric such as silicon dioxide. In some areas, moisture barrier 110 includes a pair of silicon nitride or other moisture impervious dielectric material elements 119 with dielectric layer 121 therebetween. FIG. 3 shows moisture barrier 110 in an area with one element 119 surrounded by dielectric layer 121 (e.g., of interconnect layer(s) 118), and FIG. 4 shows an area with a pair of elements 119 with dielectric layer 121 therebetween (and also around it as part of interconnect layer(s) 118). Other forms of moisture barrier are also possible. Moisture barrier 110 can be formed using any now known or later developed semiconductor fabrication techniques. As understood in the field, in some cases, moisture barrier 110 may also provide electric guard ring functionality. However, as illustrated, in certain embodiments, moisture barrier 110 may be used with a primary guard ring 114 (hereafter "guard ring 114") (see e.g., FIGS. 1, 2 and 4). Guard ring 114 may include any now known or later developed layered conductive elements 123 (FIG. 4) coupled to ground to electrically isolate active circuitry 104 and other components of structure 100 from, among other things, electrical interference. In certain embodiments, structure 100 may also include one or more crack stops 120 (see e.g., FIGS. 2-4) that is within and/or surrounds moisture barrier 110 to prevent cracking and/or unwanted stress in the chip or in moisture barrier 110 that could lead to moisture ingress. Crack stop(s) 120 may include any now known or later developed layered conductive elements 125 (see e.g., FIG. 4). Guard ring 114 and crack stop(s) 120 can be in any MOL and/or BEOL interconnect layers 118 and can be formed using any now known or later developed semiconductor fabrication techniques.

With continuing reference to FIGS. 1-3, for purposes of description, structure 100 and, in particular, IC chip 101 is illustrated as a photonics integrated circuit (PIC) chip. PIC structures present a heightened risk of moisture ingress because they include one or more input/output (I/O) openings 130 that present moisture ingress paths through which moisture can pass through moisture barrier 110. I/O openings 130 are provided to allow connection of external photonics or electronic components 132 (FIGS. 1-3 only for clarity). External components 132 can take any now known or later developed form such as but not limited to: an optical fiber (perhaps coupled to, e.g., an external laser); waveguides of, for example, silicon, silicon nitride, aluminum nitride, polymer, metamaterial etc. In this case, structure 100 may include a photonics component 132 adjacent I/O opening 130 in moisture barrier 110. External photonics components(s) 132 may be coupled to, for example, internal optical waveguides 134 that are optically coupled to active circuitry 104 in a known fashion. I/O opening(s) 130 extends inwardly from an edge 136 (FIGS. 1-2) of IC chip 101. I/O opening(s) 130 can take any now known or later developed form such as but not limited to: V-groove(s), U-grooves, inverse taper, trident, or any other trench groove, etc. While described relative to a PIC chip, it will be recognized that the teachings of the disclosure are applicable to any IC chip having an I/O opening 130 therein.

As noted, moisture barriers 110 are subject to damage where they extend into outer corners 138 (FIG. 1 only) of I/O openings 130 in edge 136 of IC chip 101 during, for example, chip dicing, chip handling or other processes. The damage can lead to a heightened risk of moisture ingress. Crack stops 120 are also used around a chip to prevent cracks from propagating through a chip, but do not address the damage to moisture barriers 110.

Embodiments of the disclosure provide mechanisms to reduce and/or eliminate damage to moisture barriers 110 at, for example, corners 138. In embodiments of the disclosure, moisture barrier 110 and/or crack stop 120 may be modified to protect against damage. More particularly, moisture barrier 110 may include chamfers near I/O opening(s) 130 and/or modifications to crack stop(s) 120 that prevent fabrication process-related damage near the I/O opening that can lead to moisture ingress. As shown in FIGS. 1 and 3, moisture barrier 110 may include a first moisture barrier portion 140 extending along a side 142 of I/O opening 130. First moisture barrier portion 140 may be on both sides 142 of I/O opening 130. As shown in FIG. 1, moisture barrier 110 may also include a second moisture barrier portion 150 extending along edge 136 of integrated circuit (IC) chip 101. Edge 136 is an edge through which I/O opening 130 extends inwardly. In FIG. 1, second moisture barrier portion 150 also continues to encircle the rest of IC chip 101 and active circuitry 104 thereof in a polygonal manner, i.e., with four corners 152. In FIG. 1, a crack stop 120 is not provided. Rather than having the two first and second moisture linear barrier portions meet in corner 138 of IC chip 101 at I/O opening(s) 130, as shown in FIG. 1, moisture barrier 110 also includes a third moisture barrier portion 160 coupling first moisture barrier portion 140 to second moisture barrier portion 150. (For brevity, moisture barrier portions 140, 150, 160 will be referenced as “MB portion” or “MB portions” hereafter). Third MB portion 160 completes moisture barrier 110 between edge 136 of IC chip 101 and respective I/O opening 130. However, third MB portion(s) 160 is distanced from corner(s) 138 of IC chip 101 with I/O opening(s) 130, creating a chamfered corner with the other MB portions. In this manner, any damage caused by fabrication processes at corner(s) 138 does not, or at least is much less likely to, damage moisture barrier 110. Although not necessary in all cases, third MB portions 160 may exist on both sides of I/O opening 130, as illustrated.

Third MB portion 160 may take a variety of forms. In FIG. 1, for example, third MB portion 160 extends linearly at a non-orthogonal angle relative to edge 136 of IC chip 101. The non-orthogonal angle $\alpha$ can range from, for example, approximately 30°-60°. Third MB portion 160 also extends linearly at a non-orthogonal angle relative to I/O opening 130 of IC chip 101. In this manner, corner(s) 138 next to I/O opening 130 is/are devoid of any part of moisture barrier 110, and moisture barrier 110 is much less likely to be damaged by fabrication processes at corner(s) 138.

Figure 5:
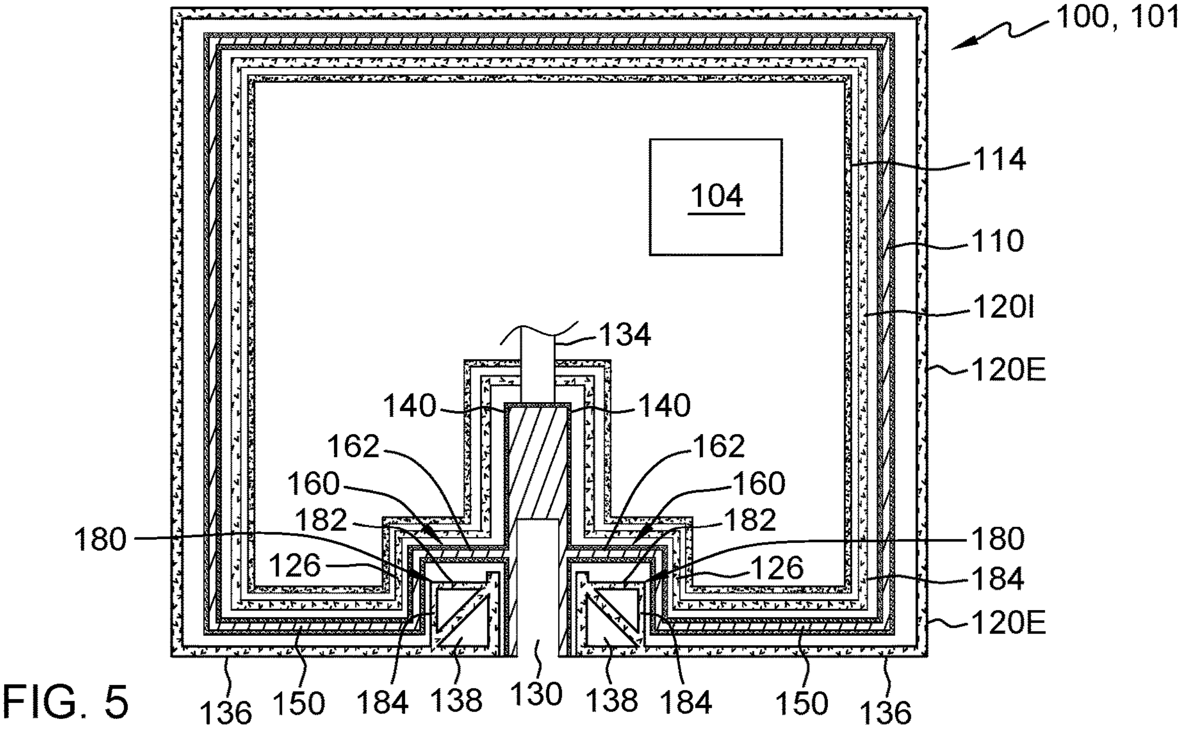
FIG. 5 shows a schematic top-down view of a structure according to embodiments of the disclosure.
Figure 6:
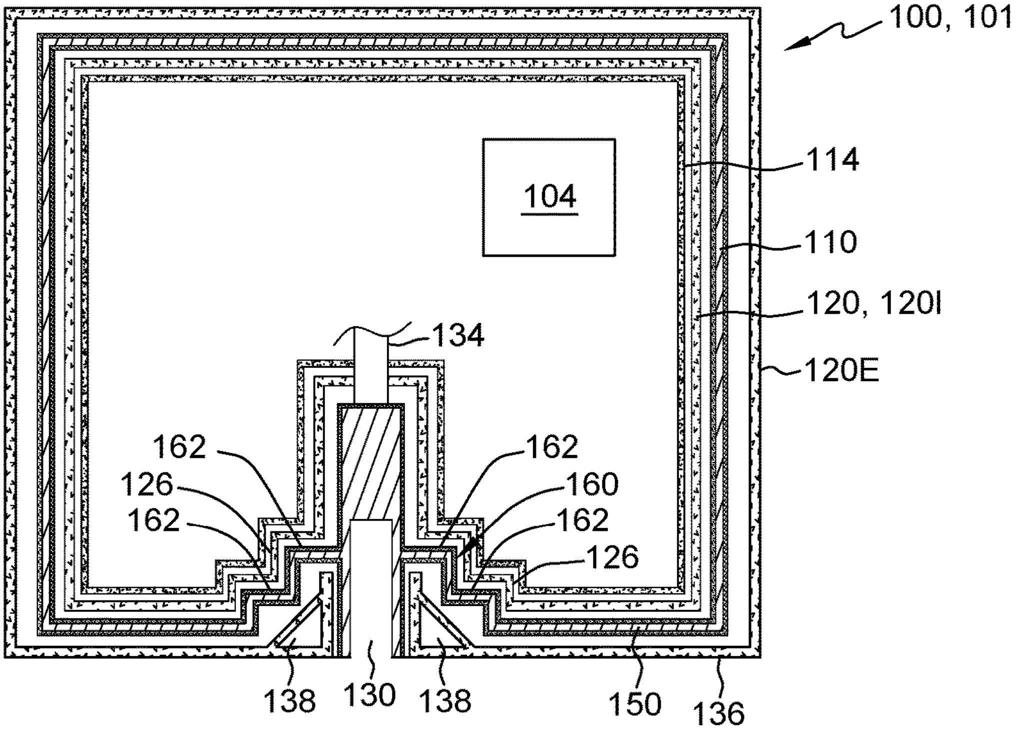
FIG. 6 shows a schematic top-down view of a structure according to embodiments of the disclosure.

FIGS. 5 and 6 show schematic top-down views of structure 100 including moisture barrier 110 according to other embodiments of the disclosure. In FIGS. 5 and 6, third MB portion 160 includes at least one right angle or step 162 therein, i.e., it is not linear as in FIG. 1. FIG. 5 shows one step 162, and FIG. 6 shows two steps 162. However, any number of steps 162 can be provided. While shown with one or more crack stops 120 in FIGS. 5-6, steps 162 can be used on moisture barriers 110 without crack stop(s) 120 as in FIG. 1.

Referring again to FIG. 2, structure 100 also may include one or more crack stops 120. In certain embodiments, a first, exterior crack stop 120E may extend around an outer periphery of moisture barrier 110. In other embodiments, such as in FIGS. 5, 6 and 9, first, exterior crack stop 120E extends around an outer periphery of moisture barrier 110, and a second, inner crack stop 120I extends around an inner periphery of moisture barrier 110. Hence, structure 100 includes two crack stops 120E, 120I.

Crack stop(s) 120 can take a variety of forms to help prevent damage at corner 138 from damaging moisture barrier 110.

In FIGS. 2 and 6, external crack stop 120E includes a first portion 172 parallel to third MB portion 160, and a second portion 174 and a third portion 176 forming a triangle with first portion 172. The triangle is in corner 138 of IC chip 101 adjacent I/O opening 130. Second portion 174 extends along edge 136 and third portion 176 extends inwardly along I/O opening 130 to couple first portion 172 and second portion 174. The triangle can have any shape within corner 138. Crack stop 120E absorbs fabrication process related damage that may damage moisture barrier 110 at corner(s) 138.

Figure 7:
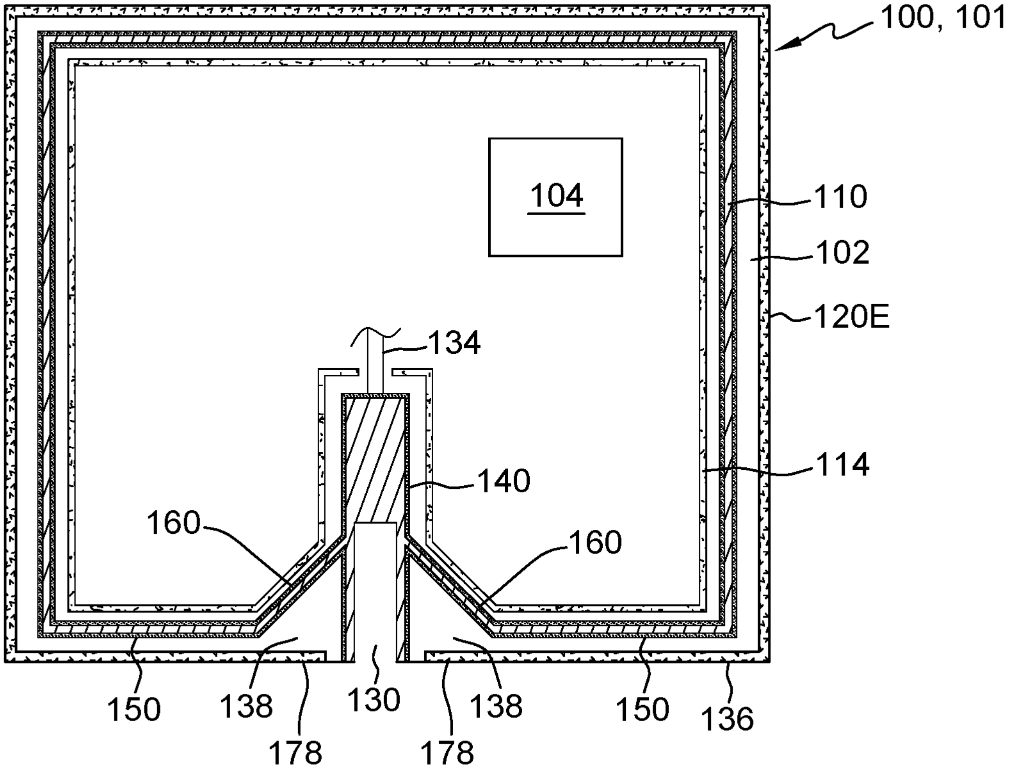
FIG. 7 shows a schematic top-down view of a structure according to embodiments of the disclosure.

FIG. 7 shows a schematic top-down view of structure 100 including moisture barrier 110 according to other embodiments of the disclosure. In FIG. 7, exterior crack stop 120E terminates at corners 138 at ends 178 thereof in a parallel fashion with edge 136 of IC chip 101 and without extending inwardly along I/O opening 130. Ends 178 may absorb any fabrication process related damage that may damage moisture barrier 110 at corners 138.

In FIG. 5, external crack stop 120E includes a square portion 180 having two sides 182, 184 that parallel third MB portion 160, i.e., within step 162.

Figure 8:
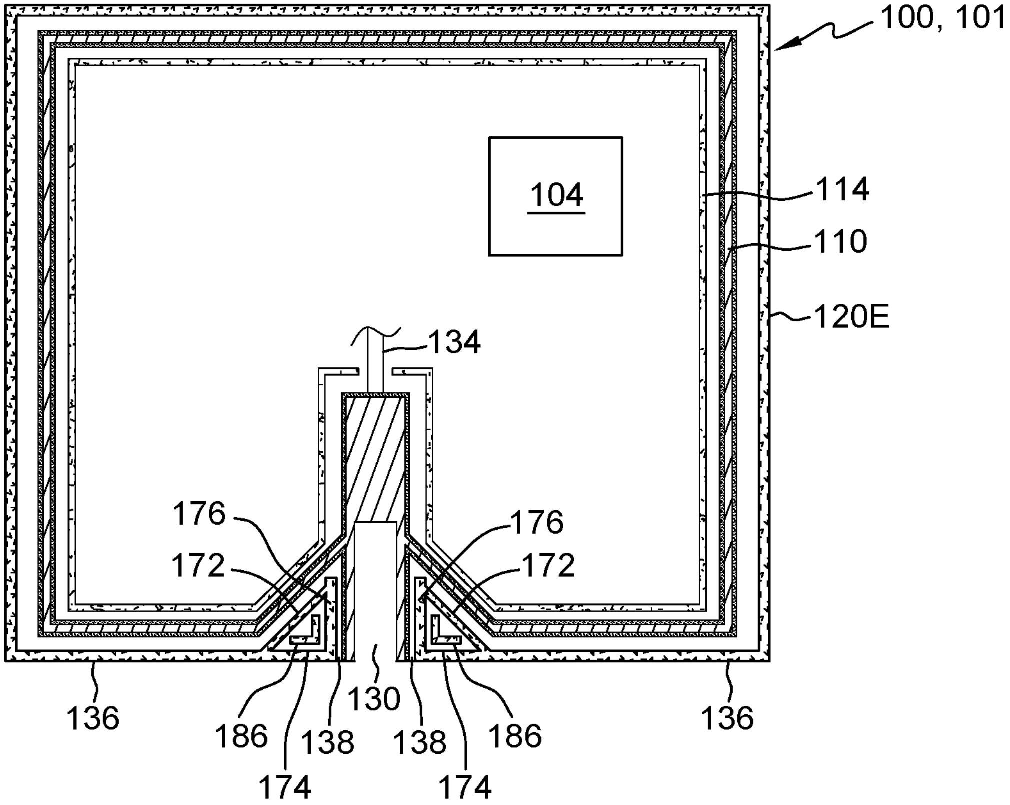
FIG. 8 shows a schematic top-down view of a structure according to embodiments of the disclosure.

FIG. 8 shows a schematic top-down view of structure 100 including moisture barrier 110 according to other embodiments of the disclosure. In FIG. 8, external crack stop 120E is similar to that in FIGS. 2 and 6, but also includes an L-shaped portion 186 within the triangle in corner 138 of IC chip 101 adjacent I/O opening 130. That is, crack stop 120E includes first portion 172 parallel to third MB portion 160, and second portion 174 and third portion 176 forming the triangle with first portion 172. The triangle is in corner 138 of IC chip 101 adjacent I/O opening 130. The triangle and L-shaped portion 186 can have any shape within corner 138, and collectively absorb fabrication process related damage that may damage moisture barrier 110.

Figure 9:
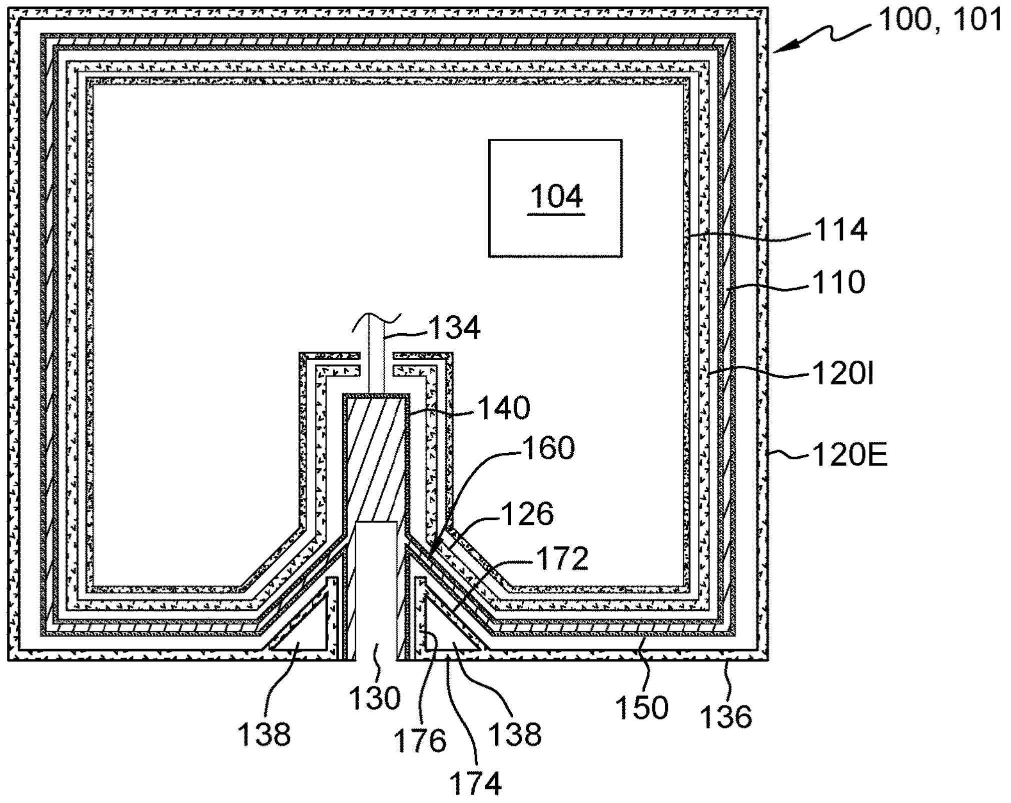
FIG. 9 shows a schematic top-down view of a structure according to embodiments of the disclosure.
Figure 10:
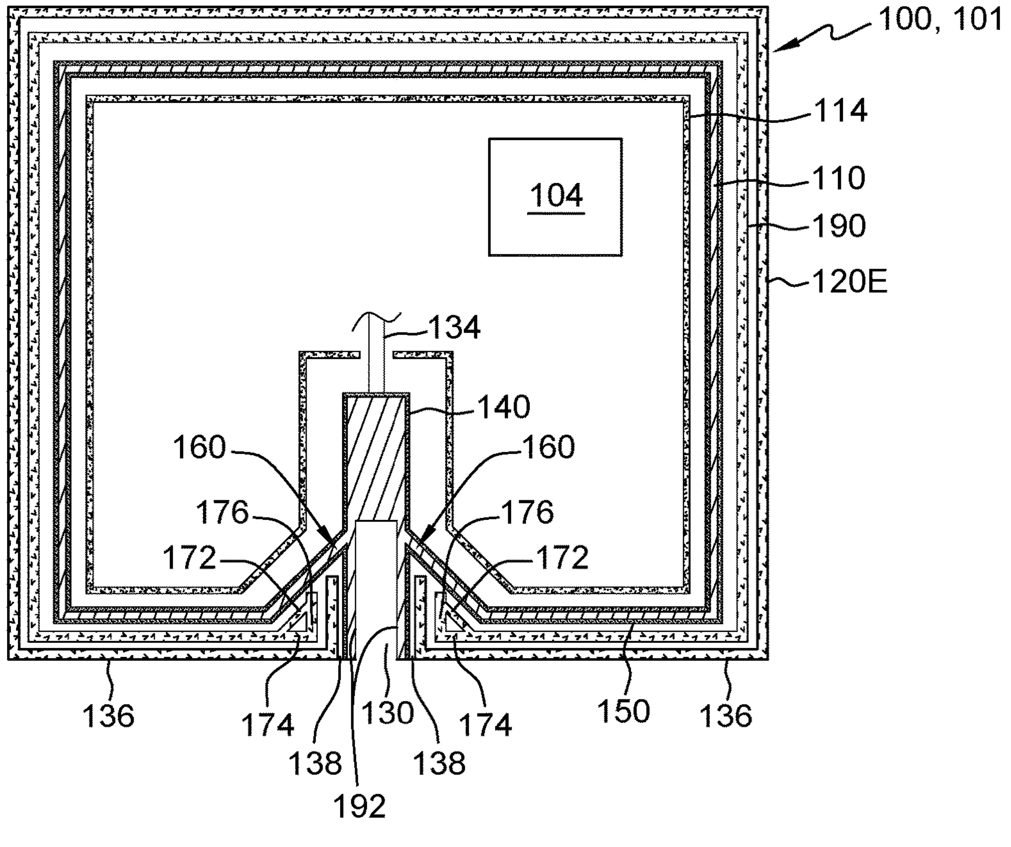
FIG. 10 shows a schematic top-down view of a structure according to embodiments of the disclosure.

FIGS. 9 and 10 show schematic top-downs view of structure 100 including moisture barrier 110 according to other embodiments of the disclosure. In FIGS. 9 and 10, external crack stop 120E is similar to that shown in FIGS. 2 and 6 and includes first portion 172 parallel to third MB portion 160, and second portion 174 and third portion 176 forming the triangle with first portion 172. The triangle is in corner 138 of IC chip 101 adjacent I/O opening 130. Second portion 174 extends along edge 136 and third portion 176 extends inwardly along I/O opening 130 to couple first portion 172 and second portion 174. As noted, the triangle can have any shape within corner 138, and absorbs fabrication process related damage that may damage moisture barrier 110. As shown, for example, in FIGS. 5, 6 and 9, another, inner crack stop 120I may extend around an inner periphery of moisture barrier 110. Inner crack stop 120I may include a portion 126 parallel to third MB portion 160. In the FIGS. 5 and 6 embodiments, portion 126 of inner crack stop 120I parallels step(s) 162 in third MB portion 160. In FIG. 9, portion 126 of inner crack stop 120I parallels a linear third MB portion 160.

As shown in FIG. 10, multiple external crack stops may be used. In FIG. 10, a second external crack stop 190 extends around an outer periphery of external crack stop 120E. External crack stop 190 includes a portion 192 parallel to I/O opening 130. External crack stops 120E and 190 collectively absorb fabrication process related damage that may damage moisture barrier 110.

Figure 11:
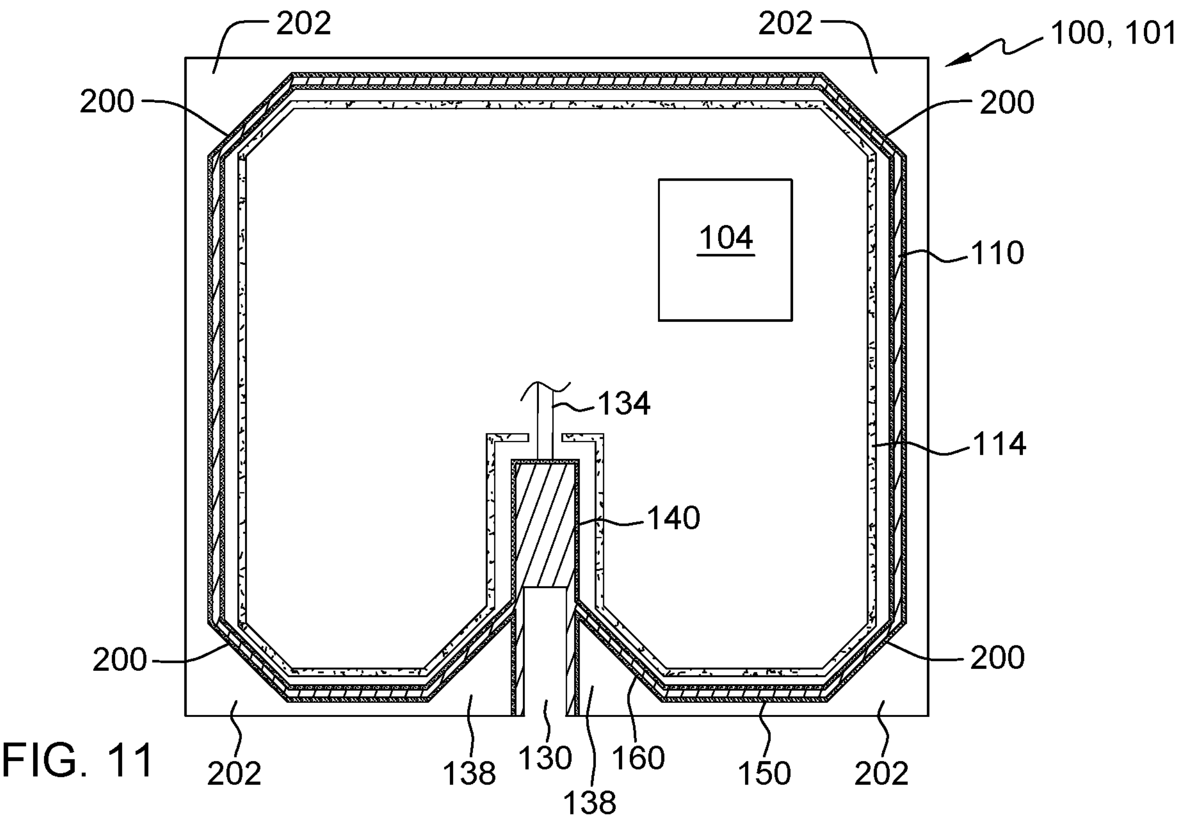
FIG. 11 shows a schematic top-down view of a structure according to embodiments of the disclosure.

FIGS. 11-14 show schematic top-downs view of structure 100 including moisture barrier 110 according to other embodiments of the disclosure. In FIG. 11, moisture barrier 110 also includes chamfers 200 at outer corners 202 of IC chip 101. Chamfers 200 can be portions of moisture barrier 110 (within second MP portion 150) that interrupt the would-be 90° corner thereof at corners 202 of IC chip 101. While all four corners 202 of IC chip 101 are shown including chamfers 200 in moisture barrier 110, not all four corners 202 require a chamfer 200. Chamfers 200 may extend linearly at a non-orthogonal angle relative to a respective adjacent edge of IC chip 101. The non-orthogonal angle can range from, for example, approximately 30°-60°.

Figure 12:
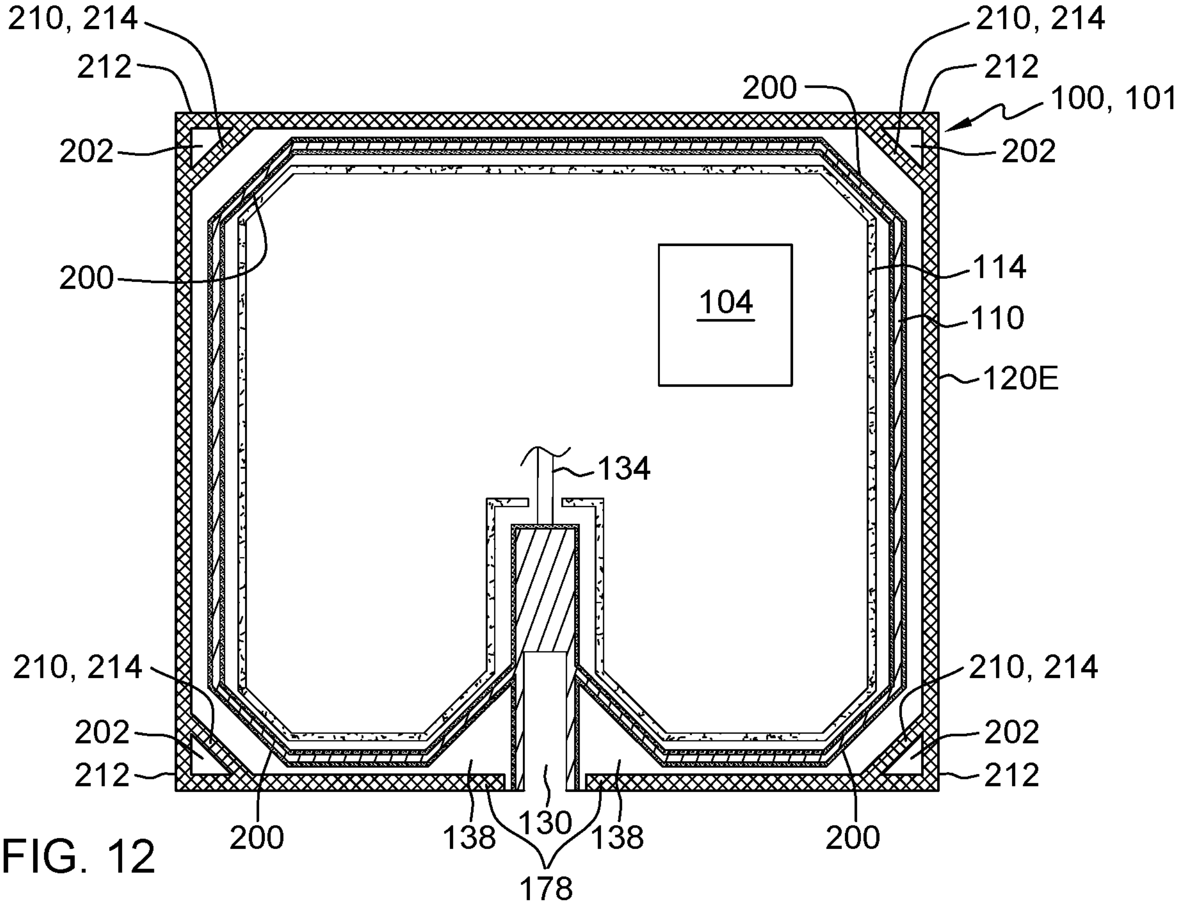
FIG. 12 shows a schematic top-down view of a structure according to embodiments of the disclosure.
Figure 13:
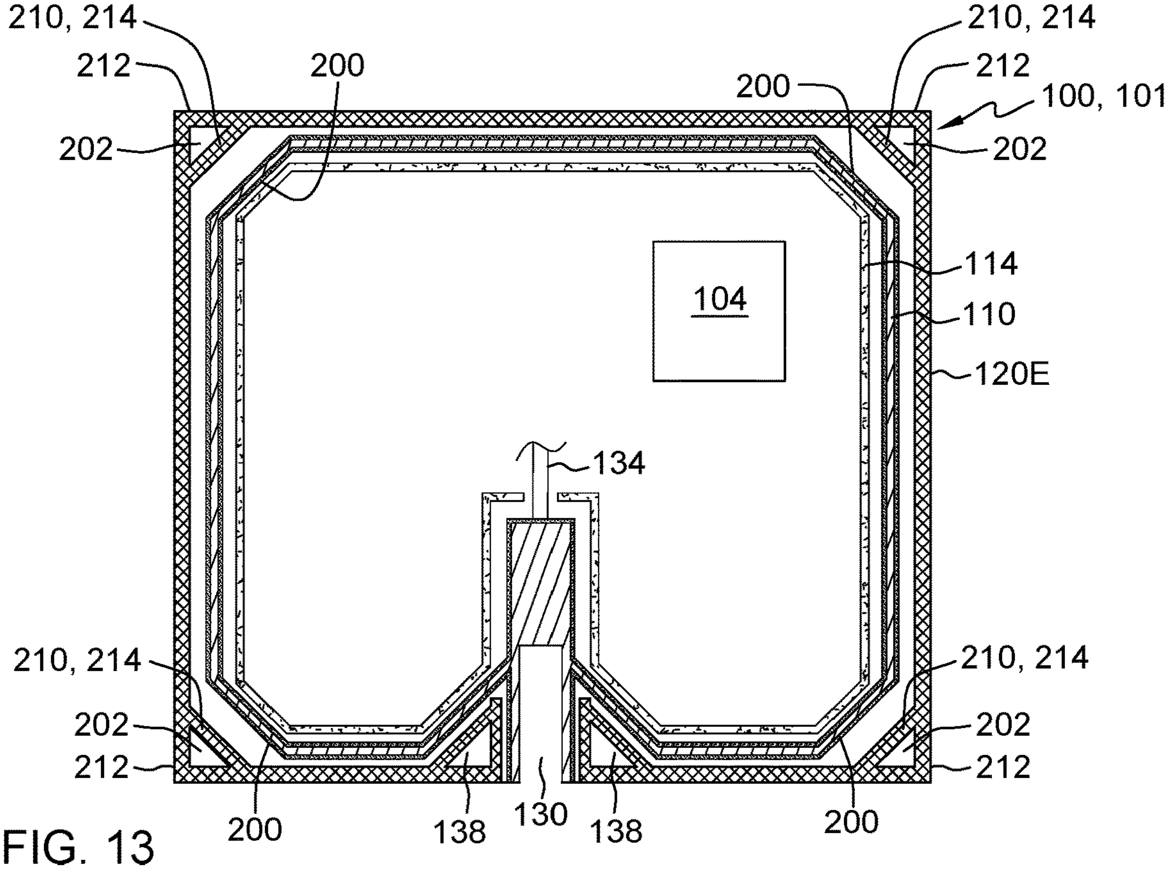
FIG. 13 shows a schematic top-down view of a structure according to embodiments of the disclosure.
Figure 14:
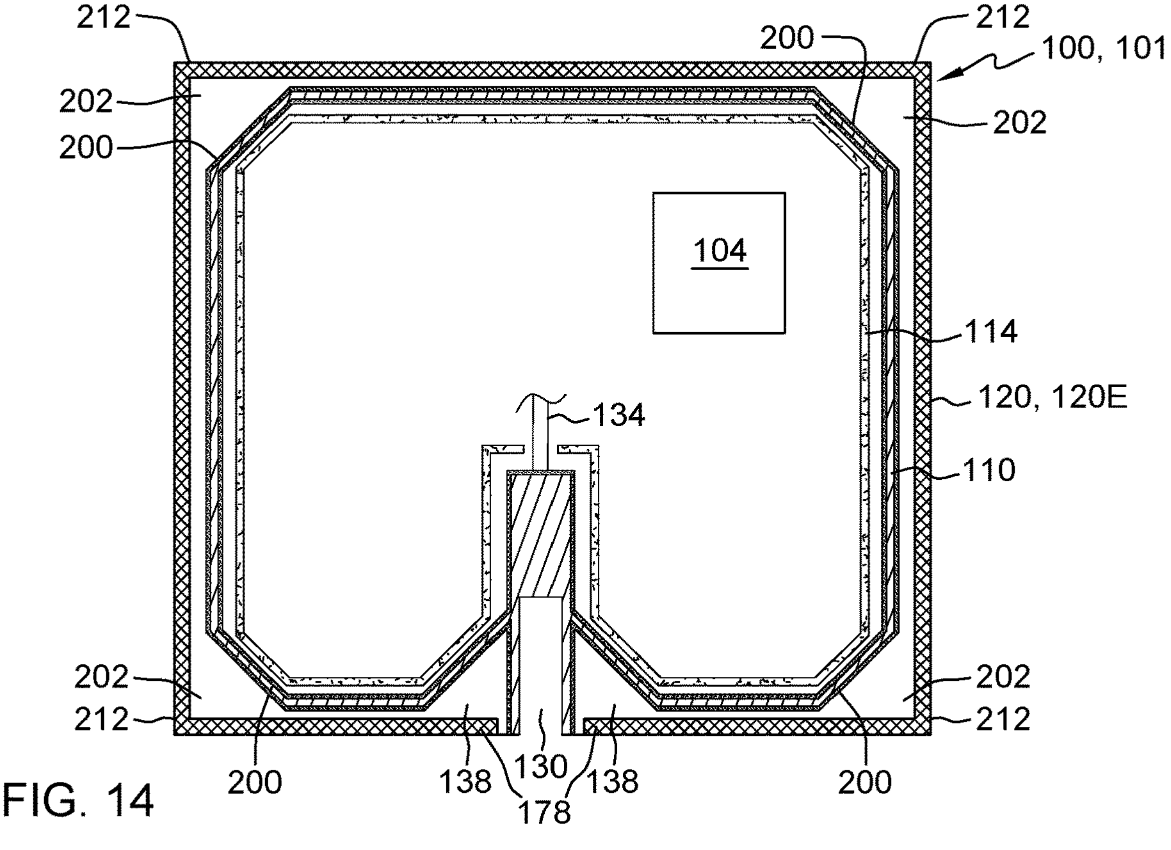
FIG. 14 shows a schematic top-down view of a structure according to embodiments of the disclosure.

FIGS. 12 and 13 show moisture barriers 110 similar to FIG. 11 and with external crack stop 120E arranged similarly to FIGS. 7 and 2, respectively, adjacent to I/O opening 130. In FIGS. 12 and 13, however, moisture barrier 110 and external crack stop 120E includes parallel chamfers 200, 210, respectively, at outer corners 202 of IC chip 101. In FIGS. 12 and 13, external crack stop 120E also includes four right angle corners 212 at corners 202 of IC chip 101 and chamfers 210 form a strut portion 214 spanning each right angle corner 212. FIG. 14 shows moisture barrier 110 with chamfers 200 and external crack stop 120E with only four right angle corners 212 (i.e., no chamfers 210 or strut portion 214) at corners 202 of IC chip 101.

Figure 15:
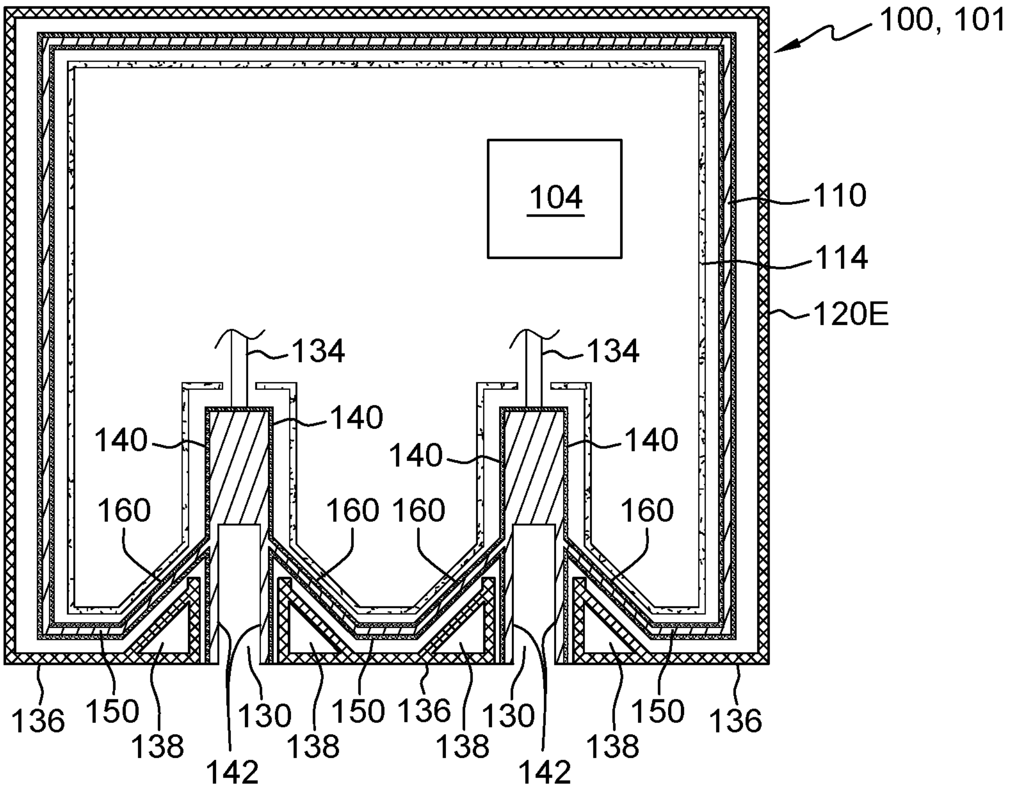
FIG. 15 shows a schematic top-down view of a structure according to embodiments of the disclosure.

As noted, structure 100 may include any number of I/O openings 130. FIG. 15 shows a schematic top-down view of structure 100 including moisture barrier 110 at a plurality of adjacent I/O openings 130, according to other embodiments of the disclosure. Each I/O opening 130 extends inwardly from edge 136 of IC chip 101. Each of the plurality of adjacent I/O openings 130 includes moisture barrier 110 including first MB portion 140 extending alongside 142 of a respective I/O opening 130 and third MB portion 160 coupling first MB portion 140 to second MB portion 150 to complete moisture barrier 110 between edge 136 of IC chip 101 and the respective I/O opening 130. Second MB portion 150 may span a space between adjacent third MB portions 160 of adjacent I/O openings 130. Any number of I/O openings 130 can be used with moisture barrier 110 similarly arranged. While the FIG. 2 embodiments of moisture barrier 110 and crack stop 120 are shown in FIG. 15, it will be recognized that any of the various embodiments of structure 100 described herein can be used with the multiple I/O openings 130 shown in FIG. 15.

While particular embodiments of structure 100 have been illustrated and described herein, it is emphasized that the various embodiments and teachings of the disclosure can be combined in arrangements other than explicitly shown, i.e., parts of the illustrated embodiments can be used with other parts of the illustrated embodiments in ways not explicitly shown.

A method according to embodiments of the disclosure may include forming IC chip 101 including substrate 102 and forming I/O opening(s) 130 extending inwardly from edge 136 of IC chip 101. The method may also include forming dielectric moisture barrier 110 including first MB portion 140 extending along side(s) 142 of I/O opening 130, second MB portion 150 extending along edge 136 of the chip, and third MB portion 160 coupling first MB portion 140 to second MB portion 150 to complete moisture barrier 110 between edge 136 of IC chip 101 and I/O opening 130. The above-described structures may be formed using any now known or later developed semiconductor fabrication processes.

Embodiments of the disclosure provide various technical and commercial advantages, examples of which are discussed herein. The structure improves IC chip moisture barrier robustness. As described, the moisture barrier and/or crack stop(s) can be optimized for mechanical, moisture, electrical, optical functioning with the smallest footprint desired.

The structure and method as described above are used in the fabrication of integrated circuit chips and/or photonics integrated circuit chips. The resulting chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

"Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
- an integrated circuit (IC) chip including a substrate;
- an input/output (I/O) opening extending inwardly from an edge of the IC chip; and
- a dielectric moisture barrier including:
  - a first moisture barrier portion extending along a side of the I/O opening,
  - a second moisture barrier portion extending along the edge of the IC chip, and
  - a third moisture barrier portion coupling the first moisture barrier portion to the second moisture barrier portion to complete the moisture barrier between the edge of the IC chip and the I/O opening,
  - wherein at least one of the first moisture barrier portion, the second moisture barrier portion, and the third moisture barrier portion include a pair of dielectric elements extending from a first side of the IC chip to the substrate, with a dielectric layer therebetween.

2. The structure of claim 1, wherein the third moisture barrier portion extends linearly at a non-orthogonal angle relative to the edge of the IC chip.

3. The structure of claim 1, wherein the third moisture barrier portion includes at least one right angle therein.

4. The structure of claim 1, further comprising a first crack stop extending around an outer periphery of the moisture barrier.

5. The structure of claim 4, wherein the first crack stop includes a first portion parallel to the third moisture barrier portion, and a second portion and a third portion forming a triangle with the first portion, the triangle in a corner of the IC chip adjacent the I/O opening.

6. The structure of claim 5, wherein the first crack stop includes an L-shaped portion within the triangle in the corner of the IC chip adjacent the I/O opening.

7. The structure of claim 5, further comprising a second crack stop extending around an outer periphery of the first crack stop, the second crack stop including a portion parallel to the I/O opening.

8. The structure of claim 4, further comprising a second crack stop extending around an inner periphery of the moisture barrier, the second crack stop including a portion parallel to the third moisture barrier portion.

9. The structure of claim 8, wherein the third moisture barrier portion and the portion of the second crack stop each include at least one right angle therein.

10. The structure of claim 9, wherein the first crack stop includes a first portion parallel to the third moisture barrier portion, and a second portion and a third portion forming a triangle with the first portion, the triangle in a corner of the IC chip adjacent the I/O opening.

11. The structure of claim 9, wherein the first crack stop includes a square portion having two sides that parallel the third moisture barrier portion.

12. The structure of claim 4, wherein the moisture barrier and the first crack stop include parallel chamfers at outer corners of the IC chip.

13. The structure of claim 1, wherein the moisture barrier includes chamfers at outer corners of the IC chip.

14. The structure of claim 13, further comprising a first crack stop extending around an outer periphery of the moisture barrier, the first crack stop having four right angle corners at corners of the IC chip and a strut portion spanning each right angle corner.

15. The structure of claim 1, wherein the I/O opening includes a plurality of adjacent I/O openings, each extending inwardly from the edge of the IC chip, and wherein each of the plurality of adjacent I/O openings includes the dielectric moisture barrier including the first moisture barrier portion extending along the side of a respective I/O opening and the third moisture barrier portion coupling the first moisture barrier portion to the second moisture barrier portion to complete the moisture barrier between the edge of the IC chip and the respective I/O opening.

16. A structure, comprising:
- an integrated circuit (IC) chip including a substrate;
- an input/output (I/O) opening extending inwardly from an edge of the IC chip; and
- a dielectric moisture barrier including:
  - a first moisture barrier portion extending along a side of the I/O opening,
  - a second moisture barrier portion extending along an entirety of the edge of the IC chip except at the I/O opening,
  - a third moisture barrier portion coupling an end of the second moisture barrier portion at a distance from the I/O opening to a location between ends of the first moisture barrier portion extending along the side of the I/O opening, and
  - wherein at least one of the first moisture barrier portion, the second moisture barrier portion, and the third moisture barrier portion include a pair of dielectric elements extending from a first side of the IC chip to the substrate, with a dielectric layer therebetween and the second moisture barrier portion includes a chamfer portion at each outer corner of the IC chip.

17. The structure of claim 16, wherein the third moisture barrier portion extends linearly at a non-orthogonal angle relative to the edge of the IC chip.

18. The structure of claim 16, wherein the third moisture barrier portion includes at least one right angle therein.

19. The structure of claim 16, further comprising a first crack stop extending around an outer periphery of the moisture barrier.

20. A method, comprising:

forming an integrated circuit (IC) chip including a substrate;

forming an input/output (I/O) opening extending inwardly from an edge of the integrated circuit chip; and forming a dielectric moisture barrier including:

a first moisture barrier portion extending along a side of the I/O opening, a second moisture barrier portion extending along the edge of the integrated circuit chip, and a third moisture barrier portion coupling the first moisture barrier portion to the second moisture barrier portion to complete the moisture barrier between the edge of the integrated circuit chip and the I/O opening, wherein at least one of the first moisture barrier portion, the second moisture barrier portion and the third moisture barrier portion, include a pair of dielectric elements extending from a first side of the IC chip to the substrate, with a dielectric layer therebetween.

* * * * *